(12) United States Patent
Zeng et al.

(10) Patent No.: US 9,460,801 B2
(45) Date of Patent: Oct. 4, 2016

(54) METHOD AND SYSTEM FOR DETERMINING STORING STATE OF FLASH MEMORY

(71) Applicants: LITE-ON ELECTRONICS (GUANGZHOU) LIMITED, Guangzhou (CN); LITE-ON TECHNOLOGY CORPORATION, Taipei (TW)

(72) Inventors: Shih-Jia Zeng, Hsinchu (TW); Chien-Fu Tseng, Hsinchu (TW); Hsie-Chia Chang, Hsinchu (TW); Yen-Yu Chou, Hsinchu (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 371 days.

(21) Appl. No.: 13/848,110

(22) Filed: Mar. 21, 2013

(65) Prior Publication Data

US 2014/0136924 A1 May 15, 2014

(30) Foreign Application Priority Data

Nov. 15, 2012 (CN) .......................... 2012 1 0462516

(51) Int. Cl.
*G11C 11/34* (2006.01)
*G11C 11/00* (2006.01)
*G11C 16/26* (2006.01)
*G06F 11/10* (2006.01)
*G11C 11/56* (2006.01)
*G11C 16/04* (2006.01)
*G11C 16/34* (2006.01)

(52) U.S. Cl.
CPC ........... *G11C 16/26* (2013.01); *G06F 11/1048* (2013.01); *G11C 11/5642* (2013.01); *G11C 16/0483* (2013.01); *G11C 16/3422* (2013.01)

(58) Field of Classification Search
None
See application file for complete search history.

(56) References Cited

U.S. PATENT DOCUMENTS

| | | | | |
|---|---|---|---|---|
| 8,493,791 B2* | 7/2013 | Karakulak et al. | ...... | 365/185.18 |
| 8,587,997 B2* | 11/2013 | Kim et al. | ...... | 365/185.02 |
| 8,817,535 B1* | 8/2014 | Yang et al. | ...... | 365/185.03 |
| 2012/0320676 A1* | 12/2012 | Lee et al. | ...... | 365/185.09 |
| 2014/0119113 A1* | 5/2014 | Xia et al. | ...... | 365/185.03 |

* cited by examiner

*Primary Examiner* — Justin R Knapp
(74) *Attorney, Agent, or Firm* — WPAT, PC; Justin King

(57) ABSTRACT

A method for determining a storing state of a flash memory is provided. The method includes the following steps. Firstly, plural first specific cell patterns are programmed into the flash memory. Then, plural second specific cell patterns are programmed into the flash memory. Then, a slicing voltage is adjusted to allow a distinguishable error percentage to be lower than a predetermined value. Afterwards, a first storing state and a second storing state of other cells of the flash memory are distinguished from each other according to the adjusted slicing voltage.

6 Claims, 7 Drawing Sheets

METHOD AND SYSTEM FOR DETERMINING STORING STATE OF FLASH MEMORY

This application claims the benefit of People's Republic of China Application Serial No. 201210462516.9, filed Nov. 15, 2012, the subject matter of which is incorporated herein by reference.

FIELD OF THE INVENTION

The present invention relates to a method and a system for controlling a flash memory, and more particularly to a method and a system for determining a storing state of a flash memory.

BACKGROUND OF THE INVENTION

As is well known, the data storage devices using NAND-based flash memories are widely used in a variety of electronic devices. For example, a SD card or a solid state drive (SSD) is a data storage device that uses a NAND-based flash memory to store data.

Depending on the data amount to be stored, the NAND-based flash memories may be classified into three types, i.e. a single-level cell (SLC) flash memory, a multi-level cell (MLC) flash memory and a triple-level cell (TLC) flash memory. The SLC flash memory can store only one bit of data per cell. The MLC flash memory can store two bits of data per cell. The TLC flash memory can store three bits of data per cell.

FIG. 1 schematically illustrates the architecture of cells of a flash memory. As shown in FIG. 1, the flash memory comprises plural cells. The flash memory may be a SLC flash memory, a MLC flash memory or a TLC flash memory. Each cell comprises a floating gate transistor. Moreover, these cells of the flash memory are arranged in several columns. The cells arranged in the same column are connected with each other. Moreover, the cells arranged in the same row are connected with a corresponding word line.

Generally, the floating gate transistor of each cell has a floating gate to store hot carriers. A threshold voltage ($V_{TH}$) of the floating gate transistor is determined according to the amount of the stored hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the flash memory, the threshold voltage of the floating gate transistor may be changed by controlling the amount of hot carriers to be injected into the floating gate. During a read cycle, a sensing circuit of the flash memory may judge the storing status of the floating gate transistor according to the threshold voltage of the floating gate transistor.

In principle, for denoting the logic data of different storing states of the cells of the flash memory, preset verification voltages $V_{VE}$ are defined according to the storing states.

FIG. 2 schematically illustrates the threshold voltage distribution curves of the SLC flash memory in different storing states. Generally, each cell of the SLC flash memory has two storing states. According to a preset verification voltage $V_{VEA}$, the two storing states are determined. For example, a storing state E and a storing state A indicate the logic data "1" and "0", respectively. Before the hot carriers are injected into the cell, the cell has the storing state E. After the hot carriers are injected into the cell, the threshold voltage $V_{THA}$ of the cell is higher than the verification voltage $V_{VEA}$, and thus the cell has the storing state A. Moreover, the storing state A is a high-level state, and the storing state E is a low-level state.

In practical, even if many cells are in the same storing state, the threshold voltages of these cells are not all identical. That is, the threshold voltages of these cells are shifted with respect to the verification voltage $V_{VEA}$. Generally, the threshold voltages of these cells are distributed in a specified distribution curve with a median threshold voltage. Please refer to FIG. 2 again. The threshold voltages of a greater number of the cells in the storing state E are the median threshold voltage $V_{THE}$, but the threshold voltages of a smaller number of cells in the storing state E are slightly higher or lower than the median threshold voltage $V_{THE}$. Similarly, the threshold voltages of a greater number of the cells in the storing state A are the median threshold voltage $V_{THA}$, but the threshold voltages of a smaller number of cells in the storing state A are slightly higher or lower than the median threshold voltage $V_{THA}$.

According to the above characteristics, a slicing voltage Vs is applied to the word line during the read cycle, and the storing state of each cell may be realized by determining whether the cell is turned on. As shown in FIG. 2, the magnitude of the slicing voltage Vs is between the distribution curve of the storing state E and the distribution curve of the storing state A. If the cell can be turned on, the storing state of the cell is in the storing state E. Whereas, if the cell fails to be turned on, the storing state of the cell is in the storing state A.

FIG. 3 schematically illustrates the threshold voltage distribution curves of the MLC flash memory in different storing states. Each cell of the MLC flash memory has four storing states E, A, B and C. The storing states E, A, B and C indicate the logic data 11, 10, 00 and 01, respectively. According to three preset verification voltages $V_{VEA}$, $V_{VEB}$ and $V_{VEC}$, the four storing states are determined. Before the hot carriers are injected into the cell, the cell is in the storing state E. As the number of hot carriers injected into the cell is gradually increased, the threshold voltage $V_{TH}$ of the cell is sequentially higher than the verification voltages $V_{VEA}$, $V_{VEB}$ and $V_{VEC}$. Consequently, the cell is sequentially switched to the storing state A, the storing state B and the storing state C. Moreover, the voltage level in the storing state C>the voltage level in the storing state B>the voltage level in the storing state A>the voltage level in the storing state E.

Similarly, even if many cells are in the same storing state, the threshold voltages of these cells are not all identical. That is, the threshold voltages of these cells are shifted with respect to the verification voltages $V_{VEA}$, $V_{VEB}$ and $V_{VEC}$. Generally, the threshold voltages of these cells are distributed in a specified distribution curve with a median threshold voltage. As shown in FIG. 3, the cells in the storing state E have a median threshold voltage $V_{THE}$, the cells in the storing state A have a median threshold voltage $V_{THA}$, the cells in the storing state B have a median threshold voltage $V_{THB}$, and the cells in the storing state C have a median threshold voltage $V_{THC}$.

Consequently, during the read cycle, a first slicing voltage Vs1, a second slicing voltage Vs2 and a third slicing voltage Vs3 are provided for detecting the four storing states of the MLC flash memory. The magnitude of each slicing voltage is between the distribution curves of two adjacent storing states.

Similarly, the storing states of the cells of the TLC flash memory are distinguished according to the above approaches, and are not redundantly described herein.

Generally, after the flash memory leaves the factory, the settings of the slicing voltages are unable to be changed. However, after the flash memory has been erased many times, the characteristics of the cells are gradually suffered from degradation. Under this circumstance, the threshold voltages of the cells are obviously shifted. If the fixed slicing voltages are used to discriminate the storing states of the cells, the storing states of the cells may be erroneously judged during the read cycle. Under this circumstance, the data error rate is increased.

SUMMARY OF THE INVENTION

An embodiment of the present invention provides a method for determining a storing state of a flash memory. The flash memory includes plural cells. Each cell is programmed to have one of a first storing state, a second storing state, a third storing state and a fourth storing state. The fourth storing state has the lowest voltage level. The third storing state has the highest voltage level. The method includes the following steps. Firstly, plural first specific cell patterns are programmed into the flash memory. Each of the plural first specific cell patterns includes a first cell and plural neighboring cells around the first cell. The first cell is programmed to have the first storing state, and the plural neighboring cells around the first cell are programmed to have the third storing state. Then, plural second specific cell patterns are programmed into the flash memory. Each of the plural second specific cell patterns includes a second cell and plural neighboring cells around the second cell. The second cell is programmed to have the second storing state, and the plural neighboring cells around the second cell are programmed to have the fourth storing state. Then, a slicing voltage is adjusted to allow a distinguishable error percentage to be lower than a predetermined value. Afterwards, the first storing state and the second storing state of other cells of the flash memory are distinguished from each other according to the adjusted slicing voltage.

Another embodiment of the present invention provides a system for determining a storing state of a flash memory. The system includes a scrambler, an ECC encoder, a specified cell pattern inserter, a flash memory, an ECC decoder, a de-scrambler, a specified cell pattern analyzer, and a slicing voltage providing unit. The scrambler is used for receiving a user data converting the user data into a scrambled user data. The ECC encoder is used for receiving the scrambled user data, thereby generating an ECC data. The specified cell pattern inserter is used for generating plural specified cell patterns. During a program cycle, the scrambled user data, the ECC data and the plural specified cell patterns are programmed into the flash memory. During a read cycle, the scrambled user data, the ECC data and the plural specified cell patterns are outputted from the flash memory according to a slicing voltage. The ECC decoder is used for generating a corrected scrambled user data according to the ECC data from the flash memory. The de-scrambler is used for receiving the corrected scrambled user data and converting the corrected scrambled user data into the user data. The specified cell pattern analyzer is used for analyzing the plural specified patterns from the flash memory, thereby generating an adjusted slicing voltage. The slicing voltage providing unit is used for updating the slicing voltage as the adjusted slicing voltage.

A further embodiment of the present invention provides a method for determining a storing state of a flash memory. The flash memory includes plural cells. The method includes the following steps. Firstly, plural first specific cell patterns are programmed into the flash memory. Each of the plural first specific cell patterns includes a first cell and plural neighboring cells around the first cell. The first cell is programmed to have the first storing state, and the plural neighboring cells around the first cell are programmed to have the second storing state. Then, plural second specific cell patterns are programmed into the flash memory. Each of the plural second specific cell patterns includes a second cell and plural neighboring cells around the second cell. The second cell is programmed to have the third storing state, and the plural neighboring cells around the second cell are programmed to have the fourth storing state. Then, a slicing voltage for distinguishing storing states of the plural first cells from storing states of the plural second cells is adjusted, so that a distinguishable error percentage is lower than a predetermined value. Afterwards, the storing states of other cells of the flash memory are distinguished from each other according to the adjusted slicing voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
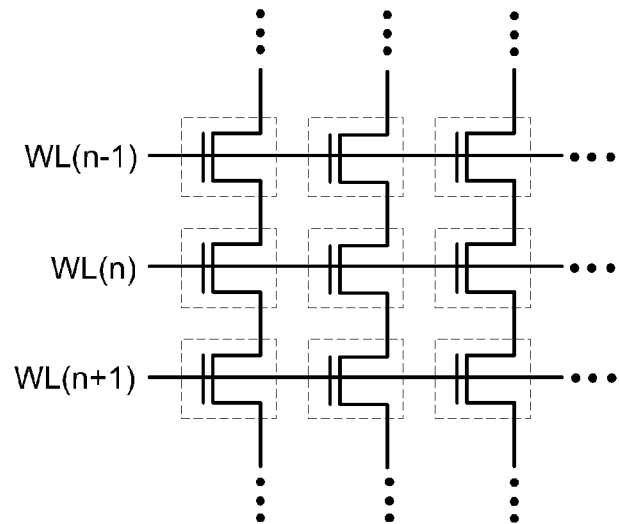
FIG. 1 (prior art) schematically illustrates the architecture of cells of a flash memory.
Figure 2:
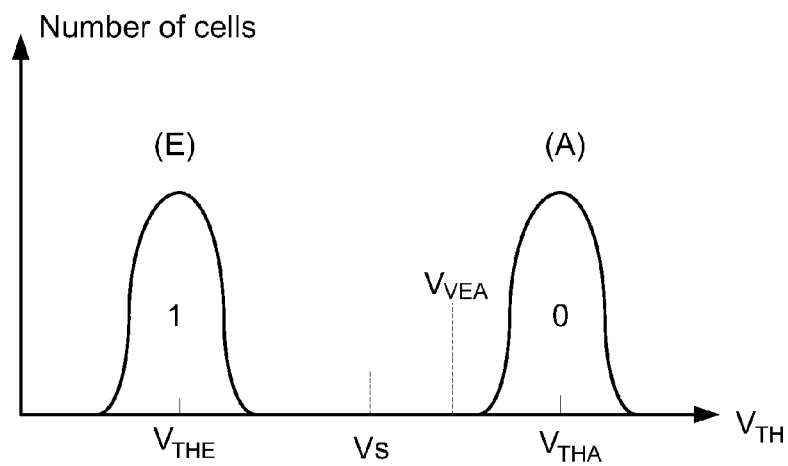
FIG. 2 (prior art) schematically illustrates the threshold voltage distribution curves of the SLC flash memory in different storing states.
Figure 3:
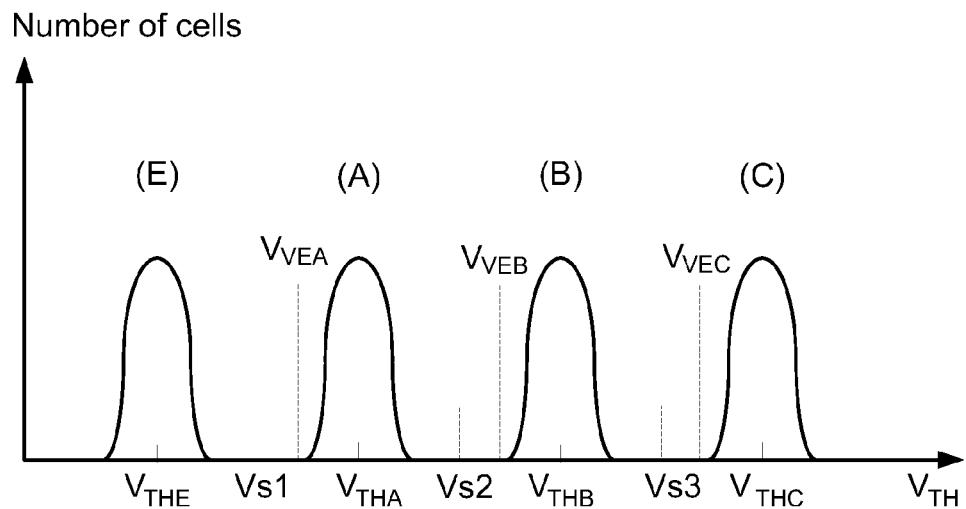
FIG. 3 (prior art) schematically illustrates the threshold voltage distribution curves of the MLC flash memory in different storing states.
Figure 4:
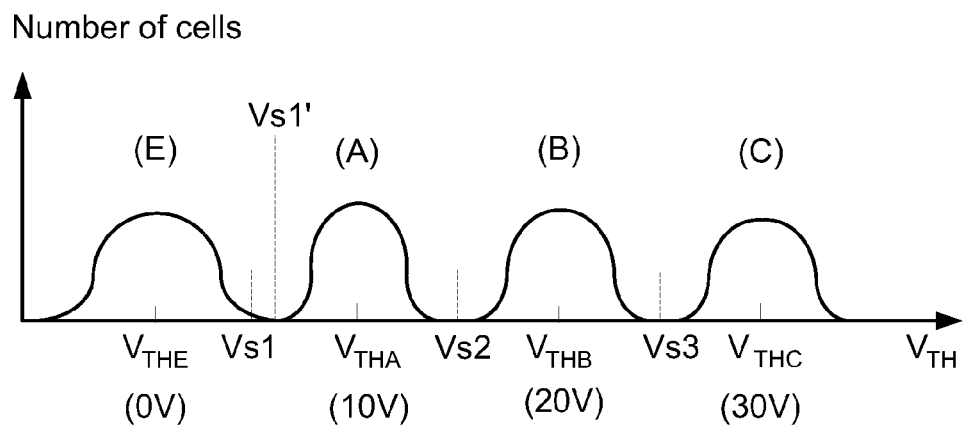
FIG. 4 schematically illustrates the threshold voltage distribution curves of the MLC flash memory in different storing states after the cells are suffered from degradation.

FIG. 4 schematically illustrates the threshold voltage distribution curves of the MLC flash memory in different storing states after the cells are suffered from degradation. As previously described, after the flash memory has been erased many times, the characteristics of the cells are gradually suffered from degradation. Under this circumstance, the threshold voltages of the some cells are obviously shifted. For example, if a small number of cells of the MLC flash memory at the storing state E are suffered from degradation, the threshold voltages of these cells are higher than the pre-defined first slicing voltage Vs1. Under this circumstance, these cells are erroneously judged to be in the storing state A by using pre-defined first slicing voltage Vs1, and the data error rate of the flash memory is increased.

The condition of causing misjudgment of FIG. 4 is presented herein for purpose of illustration and description only. It is noted that a small number of cells of the MLC flash memory at other storing states may be erroneously judged when the threshold voltages thereof are obviously shifted.

In order to reduce the data error rate of the flash memory, the present invention provides a method for determining a storing state of a flash memory according to an adjustable slicing voltage. As shown in FIG. 4, by increasing the pre-defined first slicing voltage Vs1 to an adjusted first slicing voltage Vs1', the data error rate of the flash memory can be largely reduced. Hereinafter, a way of adjusting the slicing voltage will be illustrated by referring to a MLC flash memory. Nevertheless, the concepts of the present invention can be applied to the SLC flash memory and the TLC flash memory.

In a flash memory, the threshold voltage of a central cell is usually influenced by the storing states of the neighboring cells. The interference generated by the neighboring cells is also referred as inter-cell interference (ICI). Since the shift of the threshold voltage of the central cell is influenced by the ICI, the threshold voltages of the central cells in the same storing state are distributed in a specified threshold voltage distribution curve.

The influences of ICI on the threshold voltage of the central cell will be illustrated by with reference to FIGS. 5A~5E.

Figure 5A:
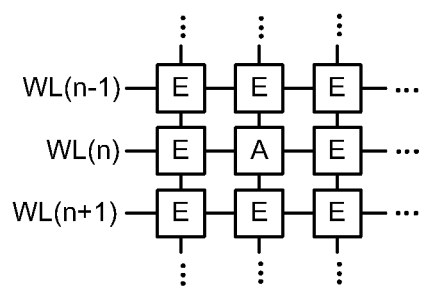
FIGS. 5A~5E schematically illustrate the influences of ICI on the threshold voltage of the central cell.

Please refer to FIG. 5A. In the 3×3 cells composed of three word lines W(n−1), W(n) and W(n+1), the central cell has the storing state A, and the eight neighboring cells around the central cell all have the storing state E. Under this circumstance, the threshold voltage $V_{AE}$ of the central cell has the lowest shift or no shift. That is, the threshold voltage $V_{AE}$ of the central cell is the closest to the verification voltage $V_{VEA}$ of the storing state A (see FIG. 5E).

Figure 5B:
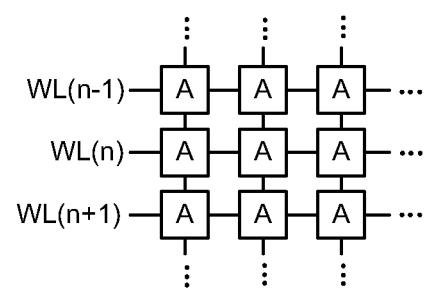

Please refer to FIG. 5B. In the 3×3 cells, the central cell has the storing state A, and the eight neighboring cells around the central cell all have the storing state A. Due to the influence of the ICI, the threshold voltage $V_{AA}$ of the central cell is shifted from the verification voltage $V_{VEA}$ of the storing state A in the positive direction. As shown in FIG. 5E, the shift amount is equal to $\Delta V_{AA}$.

Figure 5C:
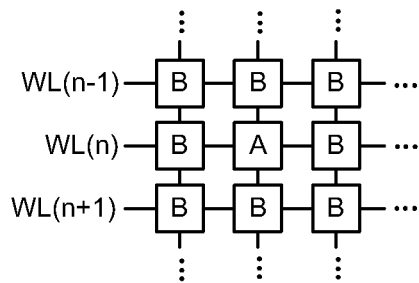

Please refer to FIG. 5C. In the 3×3 cells, the central cell has the storing state A, and the eight neighboring cells around the central cell all have the storing state B. Due to the influence of the ICI, the threshold voltage $V_{AB}$ of the central cell is also shifted from the verification voltage $V_{VEA}$ of the storing state A in the positive direction. As shown in FIG. 5E, the shift amount is equal to $\Delta V_{AB}$.

Figure 5D:
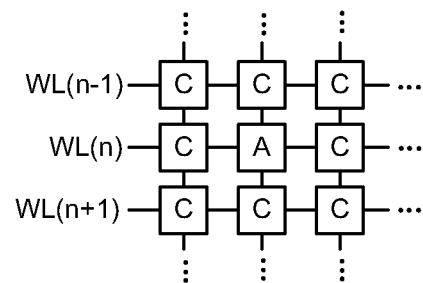
Figure 5E:
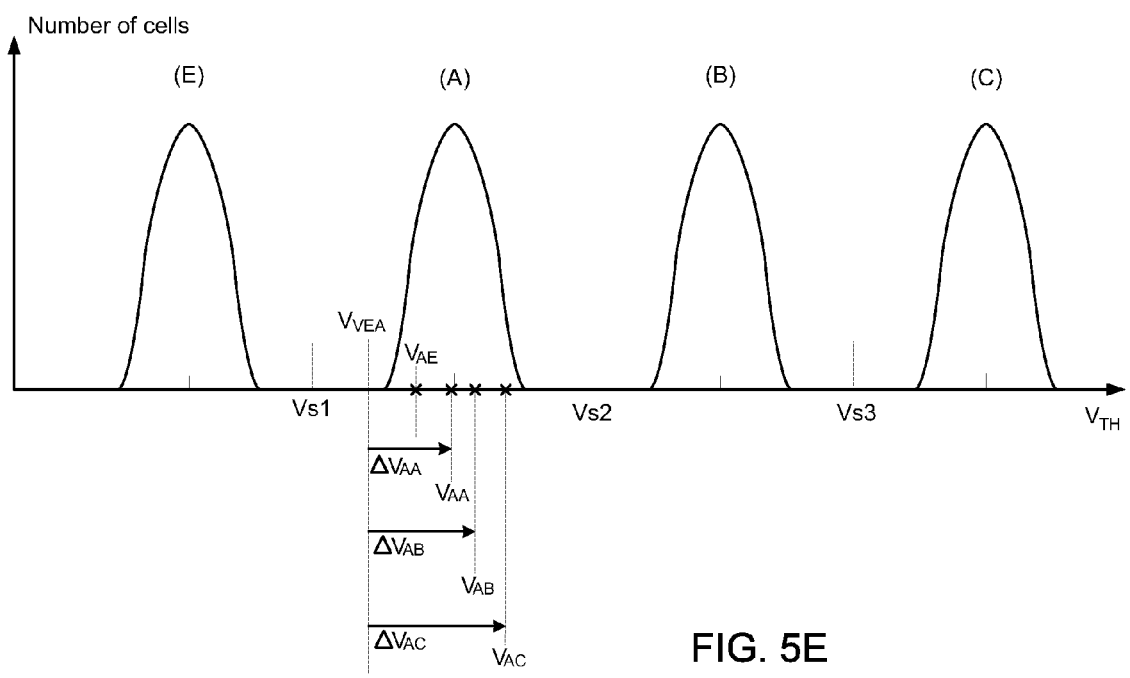

Please refer to FIG. 5D. In the 3×3 cells, the central cell has the storing state A, and the eight neighboring cells around the central cell all have the storing state C. Due to the influence of the ICI, the threshold voltage $V_{AC}$ of the central cell is also shifted from the verification voltage $V_{VEA}$ of the storing state A in the positive direction. As shown in FIG. 5E, the shift amount is equal to $\Delta V_{AC}$. It is found that the $\Delta V_{AC} > \Delta V_{AB}$ and $\Delta V_{AB} > \Delta V_{AA}$.

Regardless of what the storing state of the central cell is, if the neighboring cells are programmed to have the highest voltage level (e.g. the storing state C), the shift amount of the threshold voltage of the central cell in the positive direction is the highest. On the other hand, if the neighboring cells are programmed to have the lowest voltage level (e.g. the storing state E), the shift amount of the threshold voltage of the central cell in the positive direction is the lowest or not generated.

From the above discussions, if the central cell has the storing state A and the eight neighboring cells all have the storing state E, the shift amount of the threshold voltage of the central cell in the positive direction is the lowest or not generated. On the other hand, if the central cell has the storing state A and the eight neighboring cells all have the storing state C, the shift amount of the threshold voltage of the central cell in the positive direction is the highest.

Similarly, if the central cell has the storing state B and the eight neighboring cells all have the storing state E, the shift amount of the threshold voltage of the central cell in the positive direction is the lowest or not generated. On the other hand, if the central cell has the storing state B and the eight neighboring cells all have the storing state C, the shift amount of the threshold voltage of the central cell in the positive direction is the highest.

Similarly, if the central cell has the storing state C and the eight neighboring cells all have the storing state E, the shift amount of the threshold voltage of the central cell in the positive direction is the lowest or not generated. On the other hand, if the central cell has the storing state C and the eight neighboring cells all have the storing state C, the shift amount of the threshold voltage of the central cell in the positive direction is the highest.

According to the above characteristics, the present invention provides a method for determining a storing state of a flash memory. By this method, a slicing voltage is dynamically determined to discriminate the storing state of the cell.

Figure 6A:
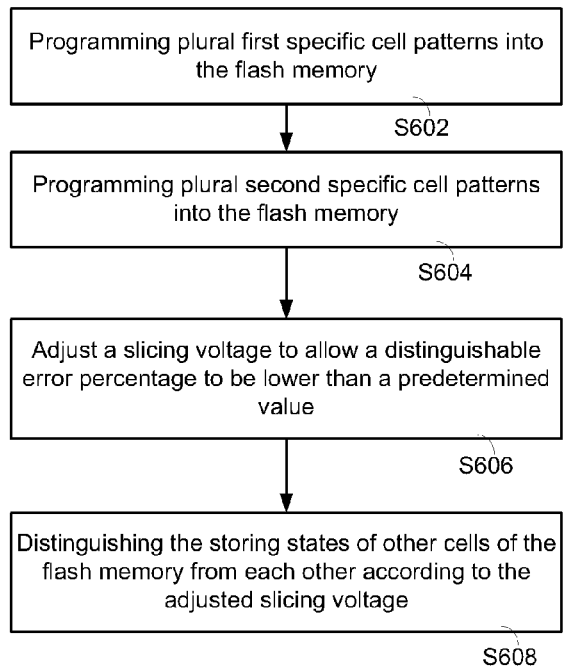
FIG. 6A is a flowchart illustrating a method for determining a storing state of a flash memory according to an embodiment of the present invention.

FIG. 6A is a flowchart illustrating a method for determining a storing state of a flash memory according to an embodiment of the present invention. Firstly, plural first specific cell patterns are programmed into the flash memory (Step S602). Then, plural second specific cell patterns are programmed into the flash memory (Step S604). Then, a slicing voltage is adjusted to allow a distinguishable error percentage to be lower than a predetermined value (Step S606). Then, the storing states of other cells of the flash memory are distinguished from each other according to the adjusted slicing voltage (Step S608). The method of the present invention will be illustrated in more details as follows.

For example, in the flash memory, the voltage level in the fourth storing state<the voltage level in the first storing state<the voltage level in the second storing state<the voltage level in the third storing state. That is, the fourth storing state has the lowest voltage level, and the third storing state has the highest voltage level.

In the step S602, the plural first specific cell patterns are programmed into the flash memory. Each of the plural first specific cell patterns comprises a first cell and plural neighboring cells around the first cell.

The first cell is programmed to have the first storing state. The plural neighboring cells around the first cell are programmed to have the third storing state.

In the step S604, the plural second specific cell patterns are programmed into the flash memory. Each of the plural second specific cell patterns comprises a second cell and plural neighboring cells around the second cell. The second cell is programmed to have the second storing state. The plural neighboring cells around the second cell are programmed to have the fourth storing state.

After the step S602 and the step S604 are performed, it means that the first cells of the plural first specific cell patterns are influenced by the ICI. For example, the threshold voltage of the first cell is shifted in the positive direction by a first shift amount. Similarly, the second cells of the plural second specific cell patterns are also influenced by the ICI. For example, the threshold voltage of the second cell is shifted in the positive direction by a second shift amount. The first shift amount is larger than the second shift amount.

In this embodiment, the voltage level of the storing state of the first cell is lower than the voltage level of the storing state of the second cell. Moreover, the voltage level of the storing state of the plural neighboring cells around the first cell is higher than the voltage level of the storing state of the plural neighboring cells around the second cell. In such way, the threshold voltage of the first cell is very close to the threshold voltage of the second cell. Under this circumstance, the distinguishable error percentage is reduced according to the adjusted slicing voltage. In a preferred embodiment, the voltage level of the storing state of the first cell and the voltage level of the storing state of the second cell are adjacent voltage levels.

For example, it is assumed that the first storing state of the cell has a preset verification voltage $V_{VE1}$ and the second storing state of the cell has a preset verification voltage $V_{VE2}$. Moreover, four first specific cell patterns and four second specific cell patterns are programmed into the flash memory.

Figure 6B:
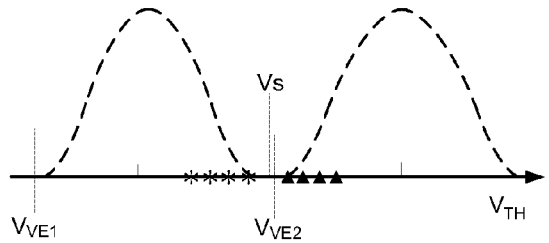
FIG. 6B schematically illustrates the threshold voltage distribution curves of two adjacent storing states in a first situation.

In the situation of FIG. 6B, the first cells of the four first specific cell patterns are programmed to have the first storing state, wherein the threshold voltages of the four first cells are indicated by the symbol "*". Since the storing state of the plural neighboring cells around the first cell has the higher voltage level, the four threshold voltages are shifted in the positive direction of the verification voltage $V_{VE1}$ by larger shift amounts. That is, the four threshold voltages of the first cells are located at the right side of the threshold voltage distribution curve of the first storing state. Similarly, the second cells of the four second specific cell patterns are programmed to have the second storing state, wherein the threshold voltages of the four second cells are indicated by the symbol "Δ". Since the storing state of the plural neighboring cells around the second cell has the lower voltage level, the four threshold voltages are shifted in the positive direction of the verification voltage $V_{VE2}$ by smaller shift amounts. That is, the four threshold voltages of the second cells are located at the left side of the threshold voltage distribution curve of the second storing state.

In the situation of FIG. 6B, the four threshold voltages of the first storing state and the four threshold voltages of the second storing state are not overlapped with each other. Consequently, in the step S606, the first storing state of the first specific cell pattern and the storing state of the second specific cell pattern can be successfully distinguished from each other according to the adjusted slicing voltage Vs. Under this circumstance, the distinguishable error percentage is zero.

Figure 6C:
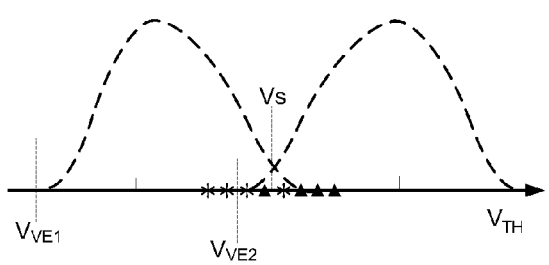
FIG. 6C schematically illustrates the threshold voltage distribution curves of two adjacent storing states in a second situation.

In the situation of FIG. 6C, the four threshold voltages of the first storing state and the four threshold voltages of the second storing state are partially overlapped with each other. Under this circumstance, the slicing voltage Vs fails to completely distinguish all of the first storing states from all of the second storing states. In accordance with the present invention, the slicing voltage is adjusted to allow the distinguishable error percentage to be lower than a predetermined value (Step S606). The distinguishable error percentage indicates the error percentage of distinguishing the storing state of the plural first cells from the storing state of the plural second cells.

Afterwards, in the step S608, the storing states of other cells of the flash memory are distinguished from each other according to the adjusted slicing voltage Vs. That is, the storing states of the cells of the flash memory for storing the user data are distinguished from each other according to the adjusted slicing voltage Vs.

The method of the present invention is illustrated by referring to the MLC flash memory. It is noted that the method for determining a storing state of a flash memory according to the present invention may be applied to a SLC flash memory or a TLC flash memory.

In a case that the method is applied to the SLC flash memory, the fourth storing state is equivalent to the first storing state and the second storing state is equivalent to the third storing state.

As known, each block comprises plural pages, for example 64 pages. Each page is typically 8K bytes in size. Due to the inherent properties of the flash memory, at least one page is written at a time during the writing operation is performed, and the erasing operation is performed in a block-wise fashion.

Figure 7:
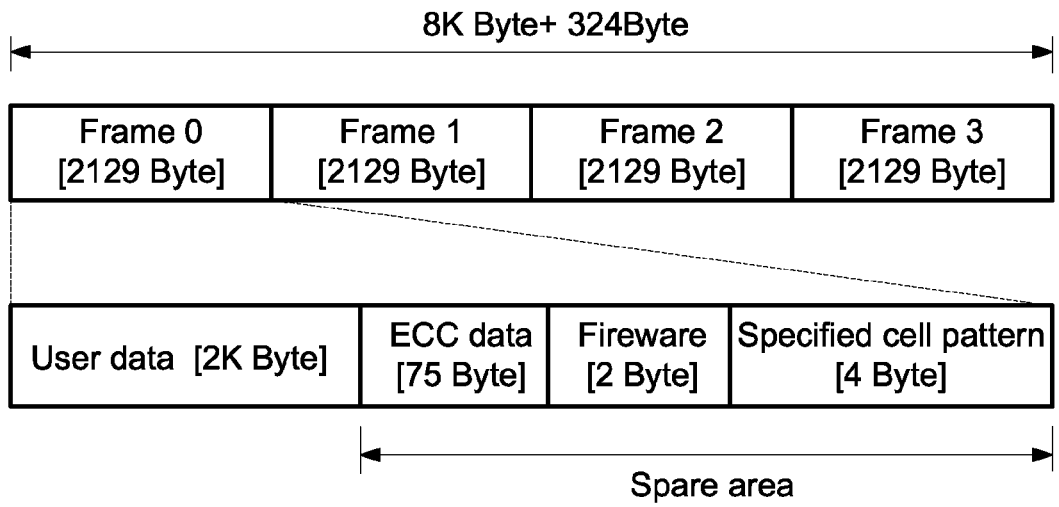
FIG. 7 schematically illustrates the layout of an 8K-byte page.

Consequently, the present invention may be applied to a method of programming and reading a page of the flash memory. FIG. 7 schematically illustrates the layout of an 8K-byte page. In practice, the data of the 8K-byte page comprises 8 K bytes and 324-byte spare area. The 8K-byte page may be divided into four frames (Frame 0~Frame 3). Each frame has 2129 bytes.

For example, the 2129 bytes of the zero-frame (Frame 0) are allocated into a 2K-byte user data and an 81-byte spare area. The 81 bytes of the spare area are allocated into a 75-byte error correction code (ECC) data, a 2-byte firmware data and a 4-byte specified cell pattern. That is, once the data of a page is programmed, the specified cell pattern is also programmed into the flash memory.

Figure 8:
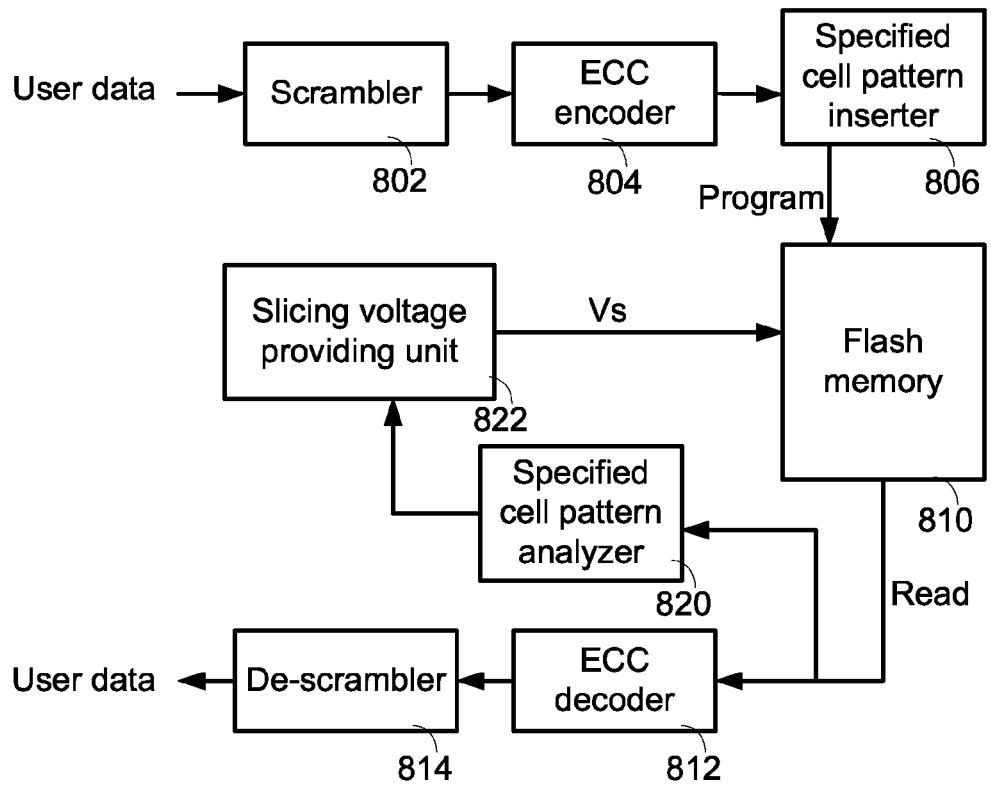
FIG. 8 is a schematic functional block diagram illustrating a system for determining a storing state of a flash memory according to an embodiment of the present invention.
Figure 9A:
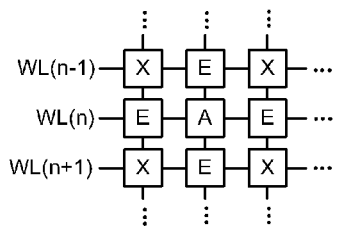
FIGS. 9A~9F schematically illustrate some other exemplary specified cell patterns.
Figure 9B:
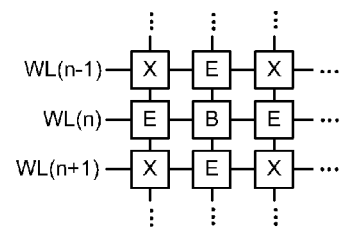
Figure 9C:
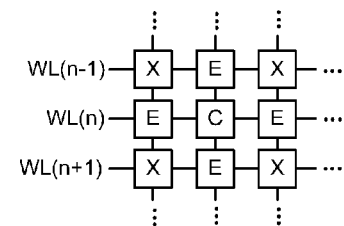
Figure 9D:
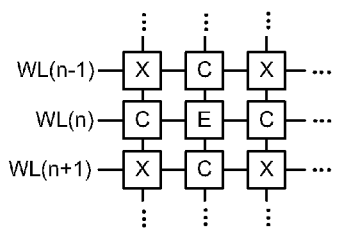
Figure 9E:
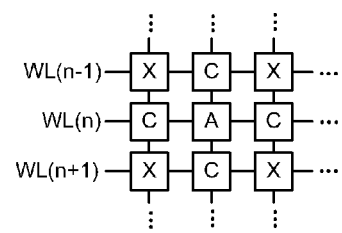
Figure 9F:
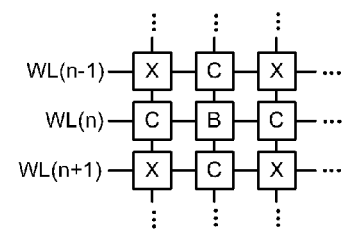

FIG. 8 is a schematic functional block diagram illustrating a system for determining a storing state of a flash memory according to an embodiment of the present invention. For programming the user data into a flash memory 810, the user data is firstly scrambled by a scrambler 802. Then, the scrambled user data is encoded by an ECC encoder 804, so that an ECC data is generated. Then, plural specified cell patterns are added to these data by a specified cell pattern inserter 806. Then, the scrambled user data, the ECC data and the plural specified cell patterns are programmed into the flash memory 810.

During a read cycle, the scrambled user data, the ECC data and the plural specified cell patterns are generated according to the slicing voltage Vs. The scrambled user data and the ECC data are recovered into the user data by an ECC decoder 812 and a de-scrambler 814, respectively.

Moreover especially, a specified cell pattern analyzer 820 is used for analyzing the plural specified patterns according to the step S606 of FIG. 6A, thereby generating an adjusted slicing voltage. The adjusted slicing voltage is updated to a slicing voltage providing unit 822.

Consequently, in the step S608 of FIG. 6A, various data of the flash memory may be generated according to the adjusted slicing voltage Vs.

In the above embodiments, the specified cell pattern comprises a central cell and eight neighboring cells around the central cell. It is noted that the number of the neighboring cells are not restricted. For example, FIGS. 9A~9F schematically illustrate some other exemplary specified cell patterns. As shown in FIGS. 9A~9F, the specified cell pattern comprises a central cell and four neighboring cells around the central cell. The symbol X indicates that the storing state is not relevant (or "don't care").

From the above descriptions, the present invention provides a method and a system for determining a storing state of a flash memory. According to an adjusted slicing voltage, two adjacent storing states of the cells of the flash memory can be distinguished from each other more accurately. Consequently, the data error rate is effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for adjusting a slicing voltage for distinguishing storing states of cells of a flash memory, the method comprising steps of:

programming plural first specific cell patterns into the flash memory, wherein each of the plural first specific cell patterns comprises a first cell and plural neighboring cells around the first cell, wherein the first cell is programmed to have a first storing state, and the plural neighboring cells around the first cell are programmed to cause a threshold voltage of the first cell to shift under an inter-cell interference;

programming plural second specific cell patterns into the flash memory, wherein each of the plural second specific cell patterns comprises a second cell and plural neighboring cells around the second cell, wherein the second cell is programmed to have a second storing state, and the plural neighboring cells around the second cell are programmed to cause a threshold voltage of the second cell to shift under the inter-cell interference, wherein the second storing state is different from the first storing state, and the shifted threshold voltages of the plural second cells are partially overlapped with the shifted threshold voltages of the plural first cells; and adjusting a slicing voltage by distinguishing storing states of the plural first cells from storing states of the plural second cells to make a distinguishable error percentage between the plural first cells and the plural second cells being lower than a predetermined value.

2. The method as claimed in claim 1, wherein the adjusted slicing voltage is used for distinguishing storing states of other cells of the flash memory.

3. The method as claimed in claim 1, wherein the plural neighboring cells around the first cell are programmed to have a third storing state, and the plural neighboring cells around the second cell are programmed to have a fourth storing state, wherein the voltage level of the first storing state is lower than the voltage level of the second storing state, and a voltage level of the third storing state of the plural neighboring cells around the first cell is higher than a voltage level of the fourth storing state of the plural neighboring cells around the second cell.

4. A system for determining an adjusted slicing voltage for distinguishing storing states of cells of a flash memory, the system comprising:

a specified cell pattern inserter for generating plural first specific cell patterns and plural second specific cell patterns, wherein each of the plural first specific cell patterns comprises a first cell and plural neighboring cells around the first cell, and each of the plural second specific cell patterns comprises a second cell and plural neighboring cells around the second cell, wherein during a program cycle, the first cell is programmed to have a first storing state, the plural neighboring cells around the first cell are programmed to cause a threshold voltage of the first cell to shift under an inter-cell interference, the second cell is programmed to have a second storing state, and the plural neighboring cells around the second cell are programmed to cause a threshold voltage of the second cell to shift under the inter-cell interference, wherein the second storing state is different from the first storing state, and the shifted threshold voltages of the plural second cells are partially overlapped with the shifted threshold voltages of the plural first cells; and a specified cell pattern analyzer for determining the adjusted slicing voltage by adjusting a slicing voltage by distinguishing storing states of the plural first cells from storing states of the plural second cells to make a distinguishable error percentage between the plural first cells and the plural second cells being lower than a predetermined value.

5. The system as claimed in claim 4, wherein the plural neighboring cells around the first cell are programmed to have a third storing state, and the plural neighboring cells around the second cell are programmed to have a fourth storing state, wherein the voltage level of the first storing state is lower than the voltage level of the second storing state, and a voltage level of the third storing state of the plural neighboring cells around the first cell is higher than a voltage level of the fourth storing state of the plural neighboring cells around the second cell.

6. The system as claimed in claim 4, wherein the plural neighboring cells around the first cell are programmed to have the second storing state, and the plural neighboring cells around the second cell are programmed to have the first storing state, wherein the voltage level of the first storing state is lower than the voltage level of the second storing state.

* * * * *